United States Patent [19]

Stamoulis et al.

[11] Patent Number: 5,838,203
[45] Date of Patent: Nov. 17, 1998

[54] METHOD AND APPARATUS FOR GENERATING WAVEFORMS USING ADIABATIC CIRCUITRY

[75] Inventors: Georgios Stamoulis, Fremont, Calif.; Yibin Ye, West Lafayette, Ind.

[73] Assignee: Intel Corporation, Santa Clara, Calif.

[21] Appl. No.: 760,905

[22] Filed: Dec. 6, 1996

[51] Int. Cl.⁶ .............................. H03L 7/06; H03B 28/00
[52] U.S. Cl. .............................. 331/1 A; 331/25; 331/74; 331/167
[58] Field of Search .................................. 331/1 A, 2, 18, 331/25, 45, 47, 48, 60, 65, 74, 117 R, 117 FE, 167, 165, 177 R; 327/129, 130, 171, 184, 295, 304

[56] References Cited

U.S. PATENT DOCUMENTS

| | | | |
|---|---|---|---|
| 3,855,554 | 12/1974 | Müller et al. | 331/167 |
| 4,731,591 | 3/1988 | Weigand | 331/65 |
| 4,972,438 | 11/1990 | Silvian | 331/166 X |
| 5,025,227 | 6/1991 | Walton | 331/65 |
| 5,559,463 | 9/1996 | Denker et al. | 331/113 R X |

OTHER PUBLICATIONS

"Low–Power Digital Systems Based on Adiabatic–Switching Principles", WC Athas et al., *IEEE Transactions on Very Large Scale Integration(VLSI) Systems*, vol. 2(4), Dec. 1994, IEEE; pp. 398–407.

"Adiabatic Dynamic Logic", AG Dickenson & JS Denker, *IEEE Journal of Solid–State Circuits*, vol. 30(3), Mar. 1995, IEEE; pp. 311–315.

*Primary Examiner*—David Mis
*Attorney, Agent, or Firm*—Blakely, Sokoloff, Taylor & Zafman

[57] ABSTRACT

A method and an apparatus for generating oscillating waveforms using adiabatic circuitry. In one embodiment, an LC oscillating circuit generates oscillating waveforms that are replenished with replenishing circuitry. The replenishing circuitry includes enable circuitry and circuitry that reduces short circuit currents that may flow through the replenishing circuit. Furthermore, the pull-up and pull-down devices of the replenishing circuit are gradually turned on and gradually turned off to reduce the introduction of glitches into the oscillating sinusoidal waveform of the oscillating circuit. A control circuit, such as a phase lock loop circuit, is included with the present invention to receive an external clock reference waveform and match the frequency and phase of the oscillating waveform in the oscillating circuit to the external clock reference waveform. Control signals are generated by the phase lock loop circuit to control the pull-up and pull-down devices of the replenishing circuit to adjust the frequency and phase of the oscillating waveform in the oscillating circuit. Accordingly, the frequency and phase of the oscillating waveform may be controlled and adjusted with an external clock reference enabling the disclosed waveform generation circuit to be integrated into a system controlled by an external clock. Inverters are included at the outputs of the oscillating circuit to convert the sinusoidal waveform into square output waveforms.

12 Claims, 9 Drawing Sheets

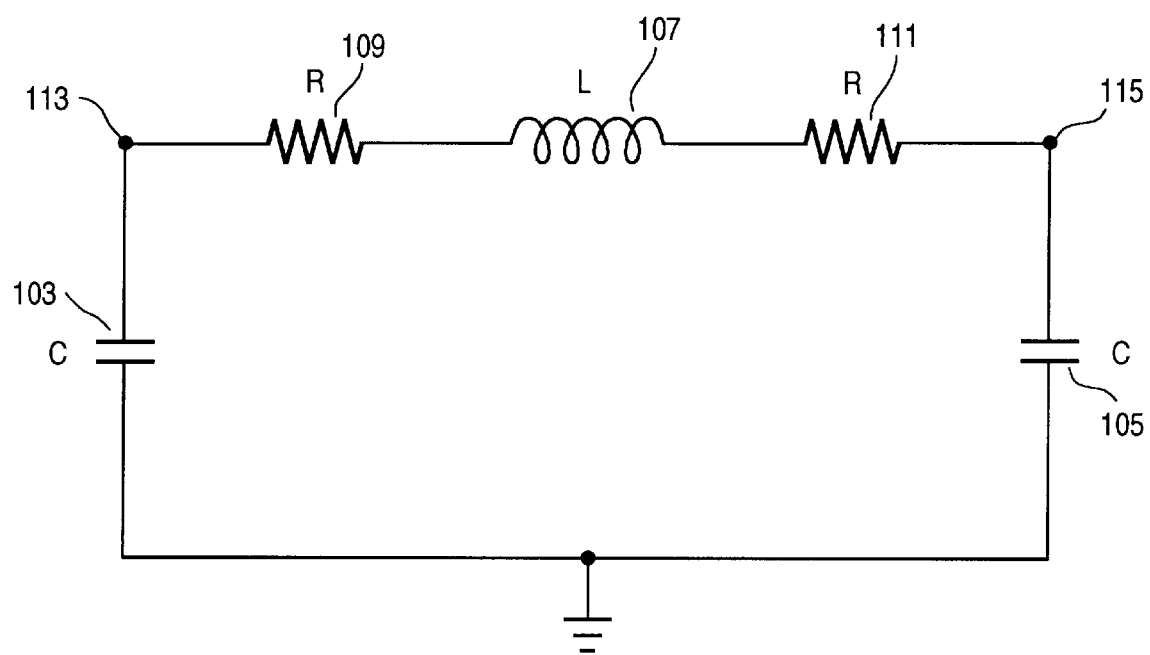
FIG_1A
(PRIOR ART)

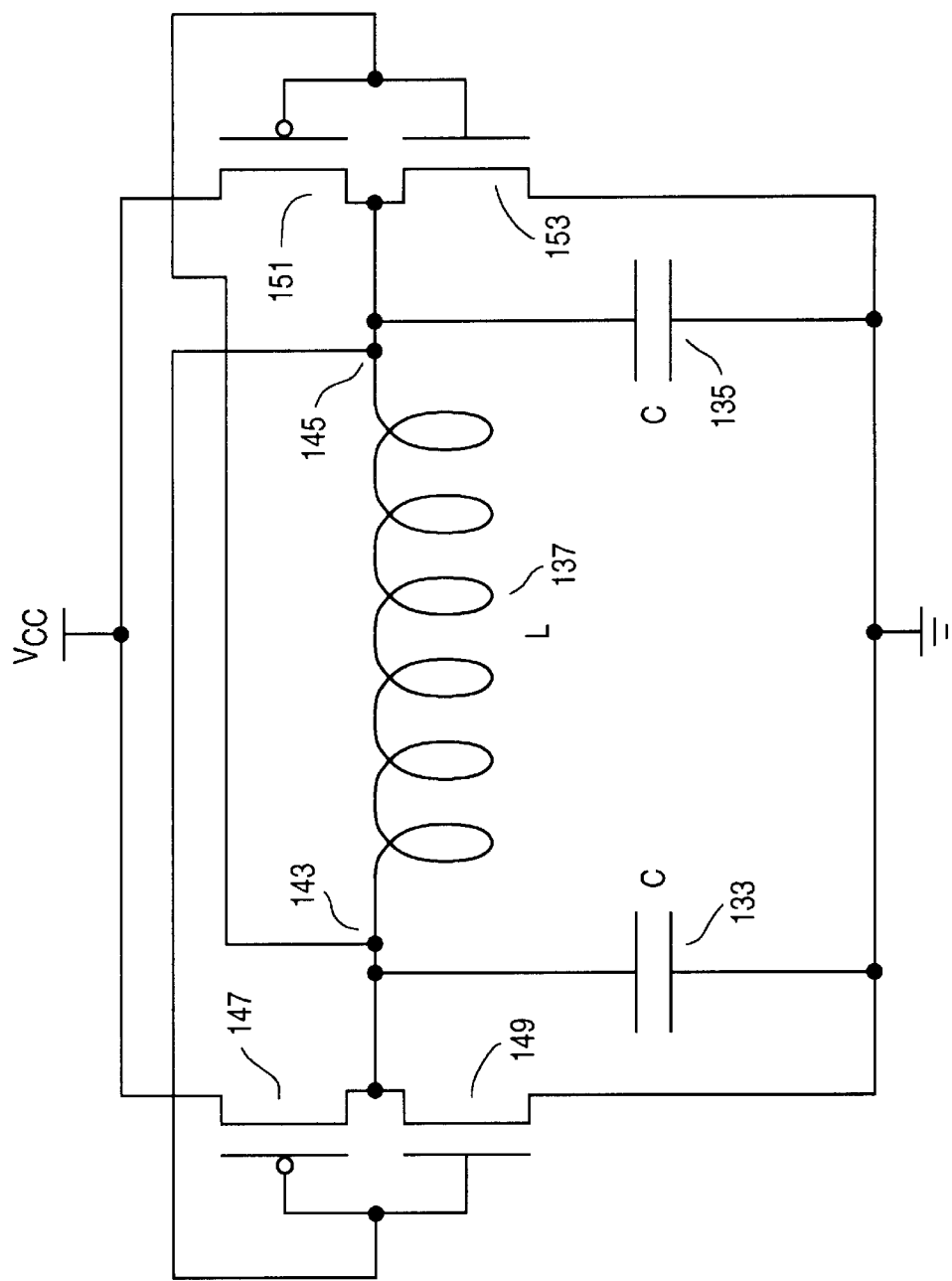
FIG_1B
(PRIOR ART)

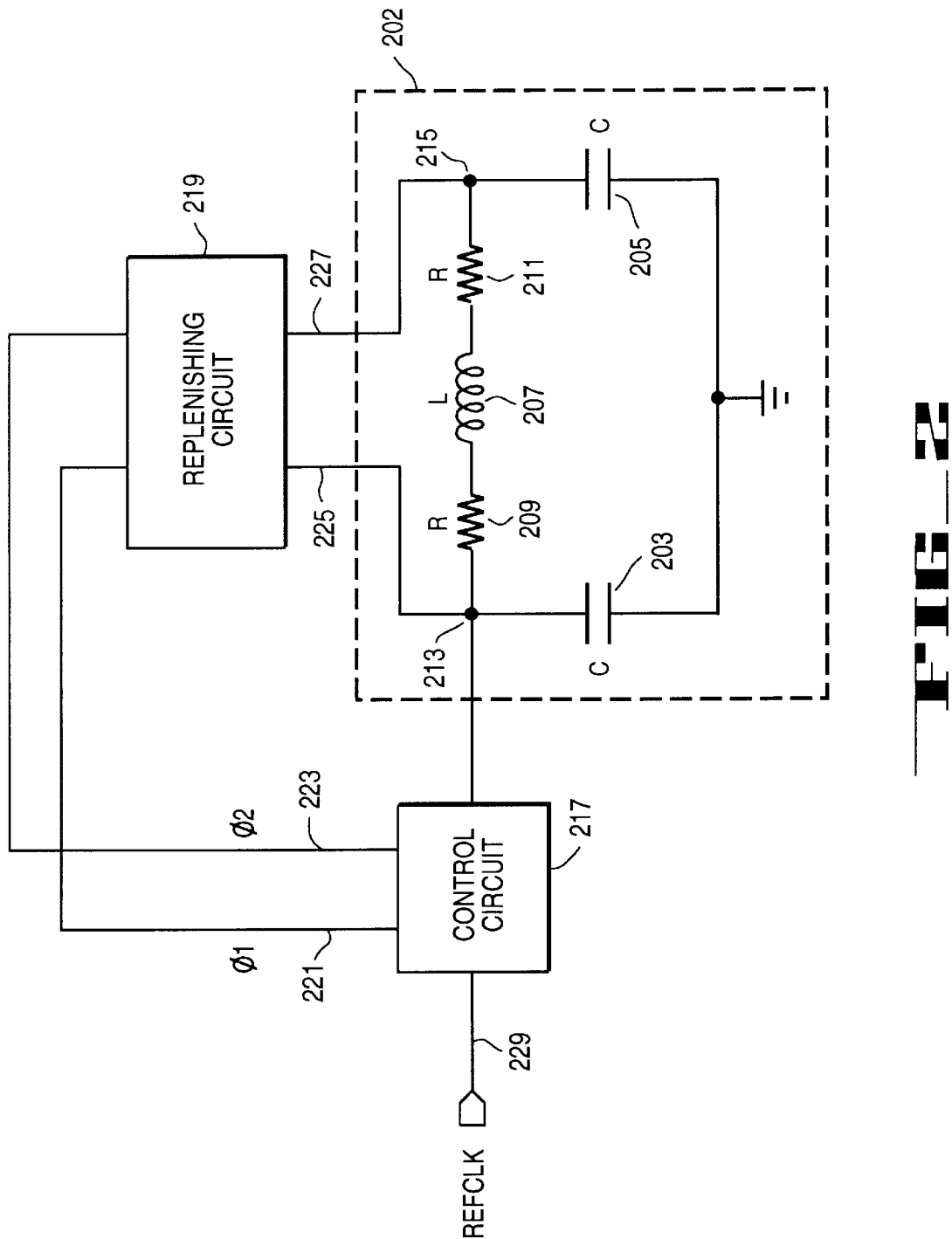
FIG_2

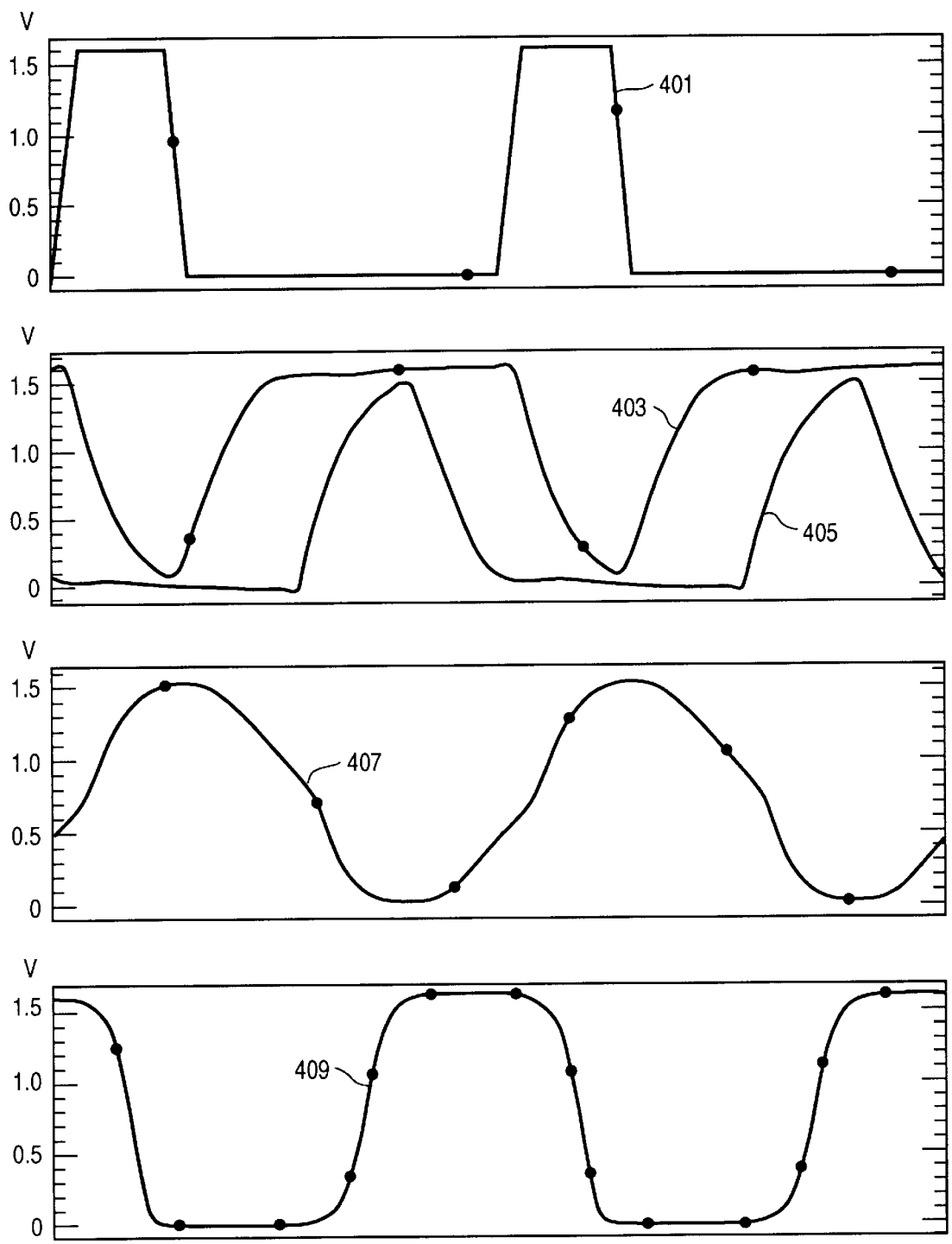
FIG_4

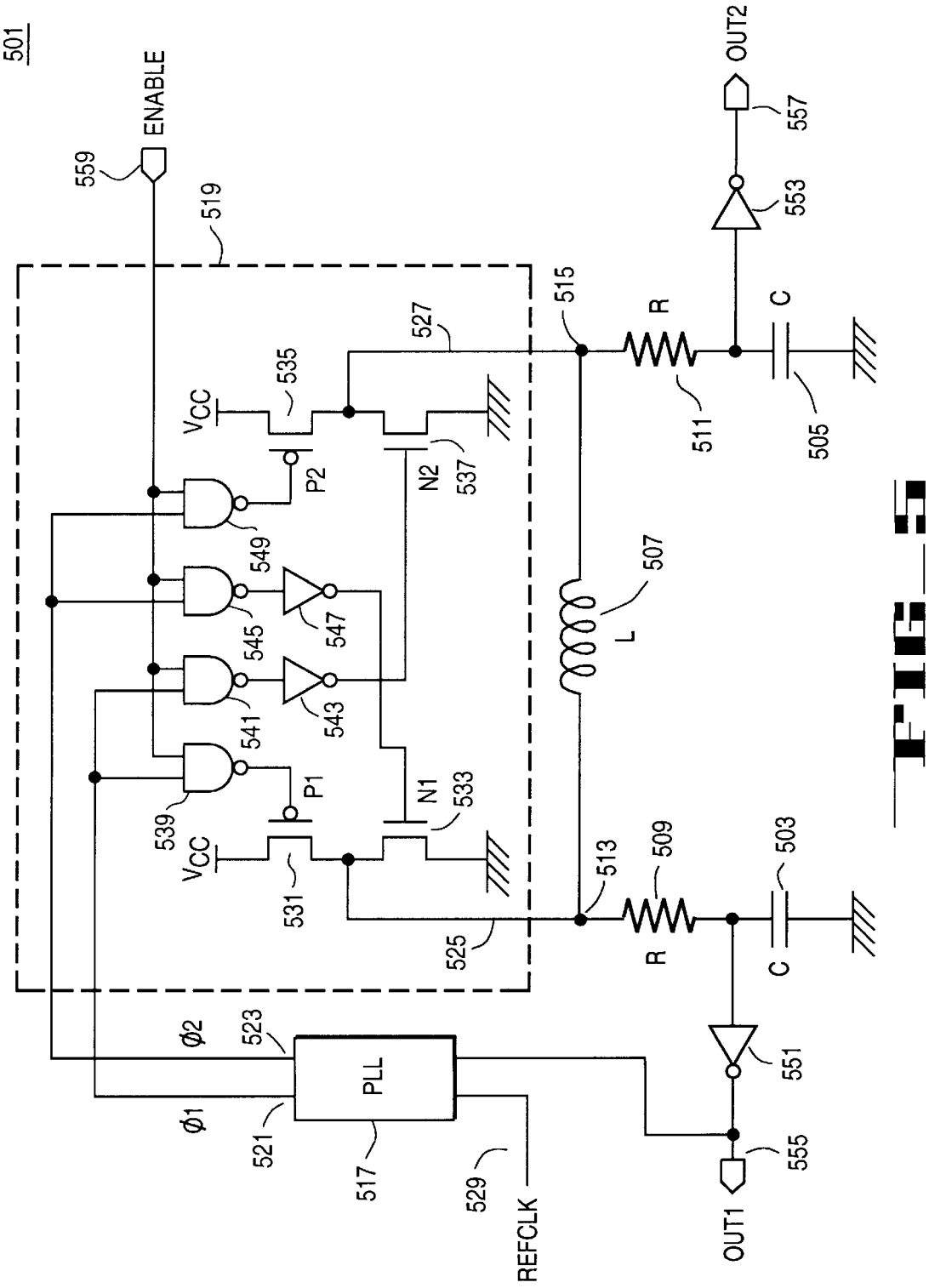
FIG_5

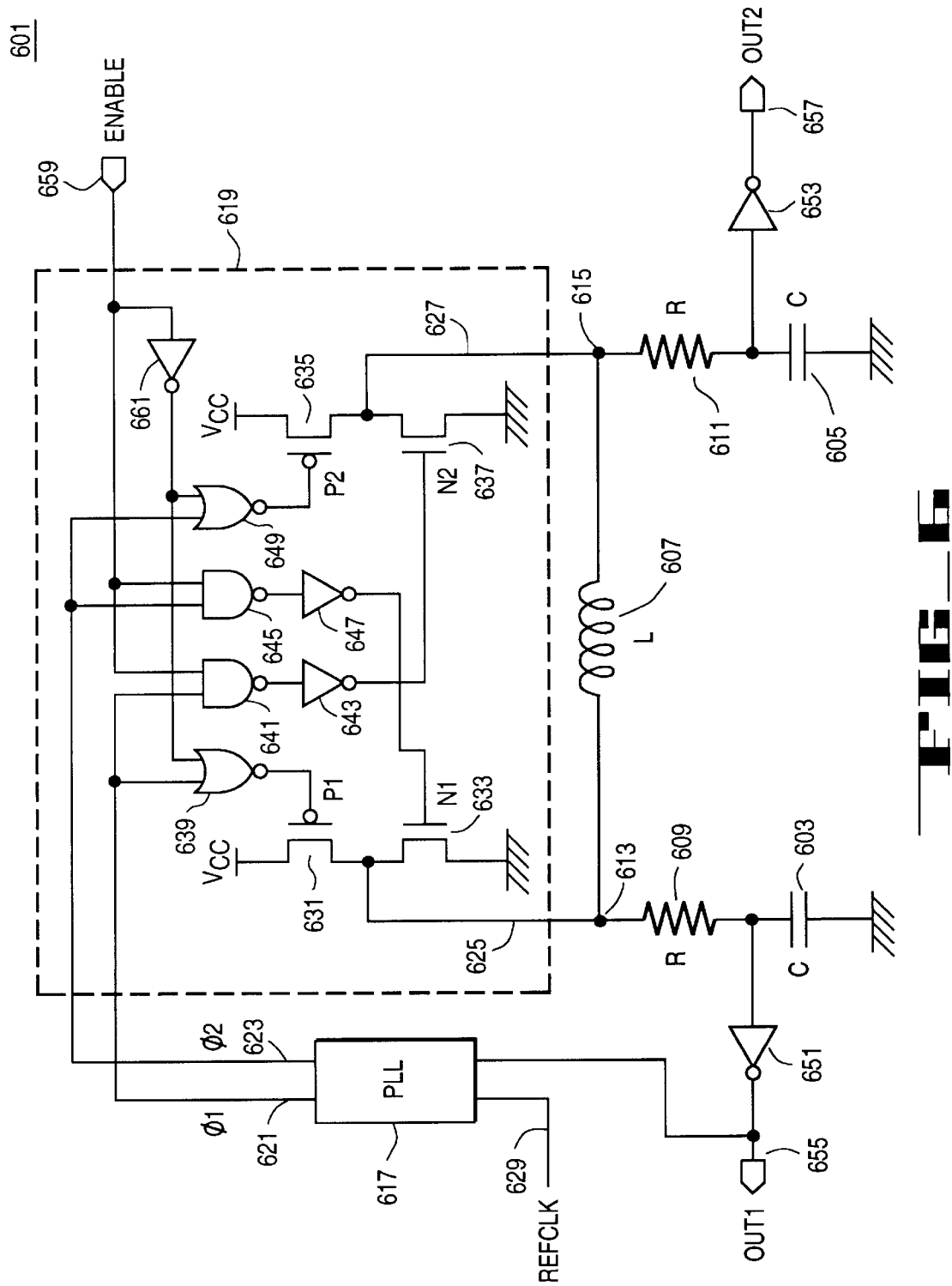
FIG_6

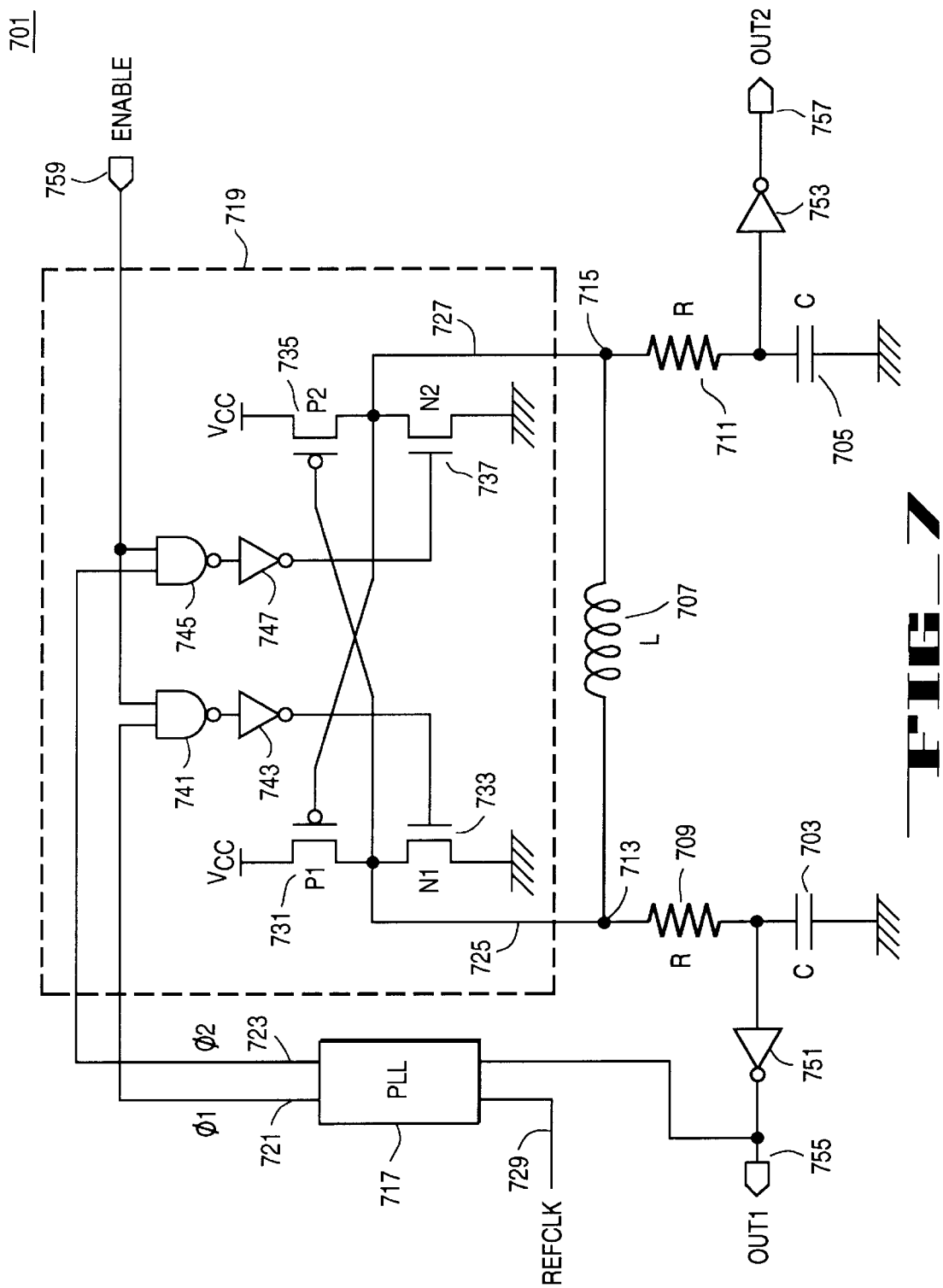

METHOD AND APPARATUS FOR GENERATING WAVEFORMS USING ADIABATIC CIRCUITRY

BACKGROUND OF THE INVENTION

1. Field of the Invention

The present invention relates generally to adiabatic circuitry and, more specifically, the present invention relates to waveform generation using adiabatic circuitry.

2. Description of the Related Art

Power dissipation and consumption has become one of the major design concerns in both high performance and portable applications. In the design of low power circuits, adiabatic driver circuits are being investigated for reducing the power dissipated when driving heavily loaded signals such as for example the clock lines of a VLSI chip. A significant percentage of total power for microprocessors and many other VLSI chips is consumed by clock lines. Therefore, applying resonant-type circuits (energy recovery circuits) to recycle energy in the clock lines reduces the total power dissipation considerably.

FIG. 1A is a schematic of a generic prior art oscillating circuit 101 which includes inductor 107 coupled between capacitors 103 and 105 as shown. The inherent resistances in the wires connecting inductor 107 to capacitors 103 and 105 are modeled as resistors 109 and 111, which are coupled between capacitor 103 and inductor 107 and capacitor 105 and inductor 107 respectively.

Assuming an initial condition of node 113 being charged to a voltage V and node 115 having an initial voltage of 0, charge and current will oscillate between capacitors 103 and 105. In particular, the charge at node 113 stored in capacitor 103 will be discharged with a current through inductor 107 into capacitor 105. Since inductor 107 tends to resist changes in current, effectively all the charge in capacitor 103 will be discharged into capacitor 105. Once all the charge has been discharged from capacitor 103 and stored in capacitor 105, the charge in capacitor 105 will then discharge from node 115 with a current through inductor 107 back into capacitor 103. In an ideal case in which there is no resistance in the wires connecting capacitor 103, inductor 107 and capacitor 105, the waveforms generated at nodes 113 and 115 are sine waves as a result of the charge oscillating between capacitors 103 and 105 as described. Since the energy oscillating between capacitors 103 and 105 is effectively "recycled," circuit 101 may be incorporated in an adiabatic waveform generator. Such a circuit may be useful in clock driver circuitry or in other similar applications which require oscillating waveforms.

A problem with circuit 101 is that with inherent resistors 109 and 111 in the wires connecting capacitor 103, inductor 107 and capacitor 105, energy is dissipated in circuit 101 causing the oscillating waveform to be dampened and consequently eliminated. Thus, in order to maintain an oscillating waveform between capacitors 103 and 105, charge must be added at precise times to aid oscillation to compensate for the dampened waveforms resulting from resistors 109 and 111. The assistance of the oscillation may be achieved by the charging of nodes 113 and 115 at precise times which are synchronized with the oscillation of the waveform between capacitors 103 and 105.

FIG. 1B is a schematic of an adiabatic circuit 131 which attempts to compensate for the dampened oscillating waveforms discussed with respect to circuit 101 of FIG. 1A. Circuit 131 includes an inductor 137 coupled between capacitors 133 and 135. Although not shown, circuit 131 also includes inherent resistances in the wires connecting capacitor 133, inductor 137 and capacitor 135 which dampens any oscillating waveforms between nodes 143 and 145. Circuit 131 also includes pull-up p-channel transistors 147 and 151 coupled between node 143 and $V_{cc}$ and node 145 and $V_{cc}$ respectively. Circuit 131 also includes pull-down n-channel transistors 149 and 153 coupled between node 143 and ground and node 145 and ground respectively. As shown in FIG. 1B, the gates of p-channel transistor 147 and n-channel transistor 149 are coupled to node 145 and the gates of p-channel transistor 151 and n-channel transistor 153 are coupled to node 143.

It is appreciated that circuit 131 is effectively circuit 101 with cross coupled inverters between nodes 143 and 145. That is, when the voltage at node 145 is low, node 143 will be charged high. When node 145 is high node 143 will be charged low. Similarly, when node 143 is charged high node 145 will be charged low and when node 143 is charged low node 145 will be charged high.

There are a number of disadvantages with prior art adiabatic circuit 131. By driving the inverter formed with transistors 147 and 149 with the signal at node 145 and by driving the inverter formed with transistors 151 and 153 with the signal at node 143, an undesired short circuit current flows between $V_{cc}$ and ground while the respective transistors are between states. That is, with sinusoidal waveforms at nodes 143 and 145, p-channel transistors 147 and 151 are not completely switched off before n-channel transistors 149 and 153 are switched on. Therefore, with both p-channel transistor 147 and n-channel transistor 149 at least partially switched on, a short circuit current flows between $V_{cc}$ and ground. Similarly, with both p-channel transistor 151 and n-channel transistor 153 switched at least partially on, a short circuit current also flows between $V_{cc}$ and ground through the transistors. This short circuit current results in unwanted power dissipation in prior art adiabatic circuit 131.

In addition, it is noted that the frequency of the waveform oscillating between capacitors 133 and 135 cannot be adjusted and is therefore fixed at a frequency determined in part by the LC constant of circuit 131. Without the ability to adjust the frequency of oscillation of prior art circuit 131, utilization of circuit 131 in modern high frequency environments is limited since it may not be possible to integrate the circuit into a whole system. For instance, other system elements operate at a frequency defined by the system instead of the LC constant of prior art circuit 131. Furthermore, it is noted that the inverters of prior art circuit 131 are driven hard which cause the degradation of waveforms at nodes 143 and 145 because of the glitches created by the respective waveforms. The resulting glitches deform the normally sinusoidal waveforms which consequently interferes with the oscillation circuitry of the system.

FIG. 1C is a schematic of another prior art attempt to solve the problem of the degradation of the waveforms described with respect to circuit 101 of FIG. 1A. Prior art adiabatic circuit 161 includes capacitor 163 and inductor 167 coupled between $V_{cc}$ and ground. Prior art circuit 161 also includes capacitor 165 and inductor 168 coupled between $V_{cc}$ and ground as shown in FIG. 1C. Also included in prior art circuit 161 are n-channel transistors 179 coupled between node 173 and ground and n-channel transistor 181 coupled between node 175 and ground. The gate of n-channel transistor 179 is coupled to node 175 and the gate of n-channel transistor 181 is coupled to node 173.

It is noted that prior art circuit 161 is similar to prior art circuit 131 with the exception of inductor 137 being split into two inductors 167 and 168 with $V_{cc}$ being coupled between inductors 167 and 168. In addition, p-channel transistors 147 and 151 of prior art circuit 131 are not present in prior art circuit 161. However, operation of prior art circuit 161 is still similar to prior art circuit 131 of FIG. 1B. In particular, a waveform oscillates between capacitors 163 and 165 with current flowing through inductors 167 and 168. When node 173 is charged high, n-channel transistor 181 is switched on pulling node 175 low. Similarly, when node 175 is charged high, n-channel transistor 179 is switched on pulling node 173 low.

Prior art circuit 161 shares many of the disadvantages discussed with respect to prior art circuit 131 above. In particular, the oscillating frequency of the waveforms between capacitors 163 and 165 cannot be adjusted and the waveforms at nodes 173 and 175 may suffer from glitches resulting from n-channel transistors 179 and 181 being switched on and off. In addition, the waveform generated at nodes 173 and 175 departs from the sinusoidal thereby decreasing efficiency.

Therefore, what is desired is a method and an apparatus for generating waveforms using an adiabatic waveform generation circuit. Such a method and an apparatus would generate oscillating waveforms using low power energy recovery adiabatic circuitry. The method and apparatus would allow the frequency of generated waveforms to be adjusted and controlled with another reference waveform while minimizing any short circuit currents as described with respect to the prior art solutions discussed above. Finally, the generated waveforms would be substantially sinusoidal with minimal glitches resulting from any circuitry that replenishes the dampened waveforms as a result of the inherent resistances in the wires of the oscillating circuits.

SUMMARY OF THE INVENTION

A method and an apparatus for generating oscillating waveforms using adiabatic waveform generation circuitry is disclosed. In one embodiment, an oscillating circuit generating first and second oscillating outputs is coupled to a replenishing circuit which generates first and second replenishing outputs coupled to the oscillating circuits. A control circuit generating first and second control signals is coupled to the replenishing circuit and is coupled to receive one of the two oscillating outputs generated by the oscillating circuit. The control circuit controls the frequency of oscillation of the first and second oscillating outputs. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

FIG. 1A is a schematic of a prior art oscillating circuit

FIG. 1B is a schematic of a prior art adiabatic waveform generation circuit.

FIG. 2 is a schematic and block diagram of an adiabatic waveform generation circuit in accordance with the teachings of the present invention.

FIG. 4 is an illustration of waveforms generated at various nodes of an adiabatic waveform generation circuit in accordance with the teachings of the present invention.

FIG. 5 is a schematic of another embodiment of an adiabatic waveform generation circuit in accordance with the teachings of the present invention.

FIG. 6 is a schematic of yet another embodiment of an adiabatic waveform generation circuit in accordance with the teachings of the present invention.

FIG. 7 is a schematic of another embodiment of an adiabatic waveform generation circuit in accordance with the teachings of the present invention.

DETAILED DESCRIPTION

Figure 1C:
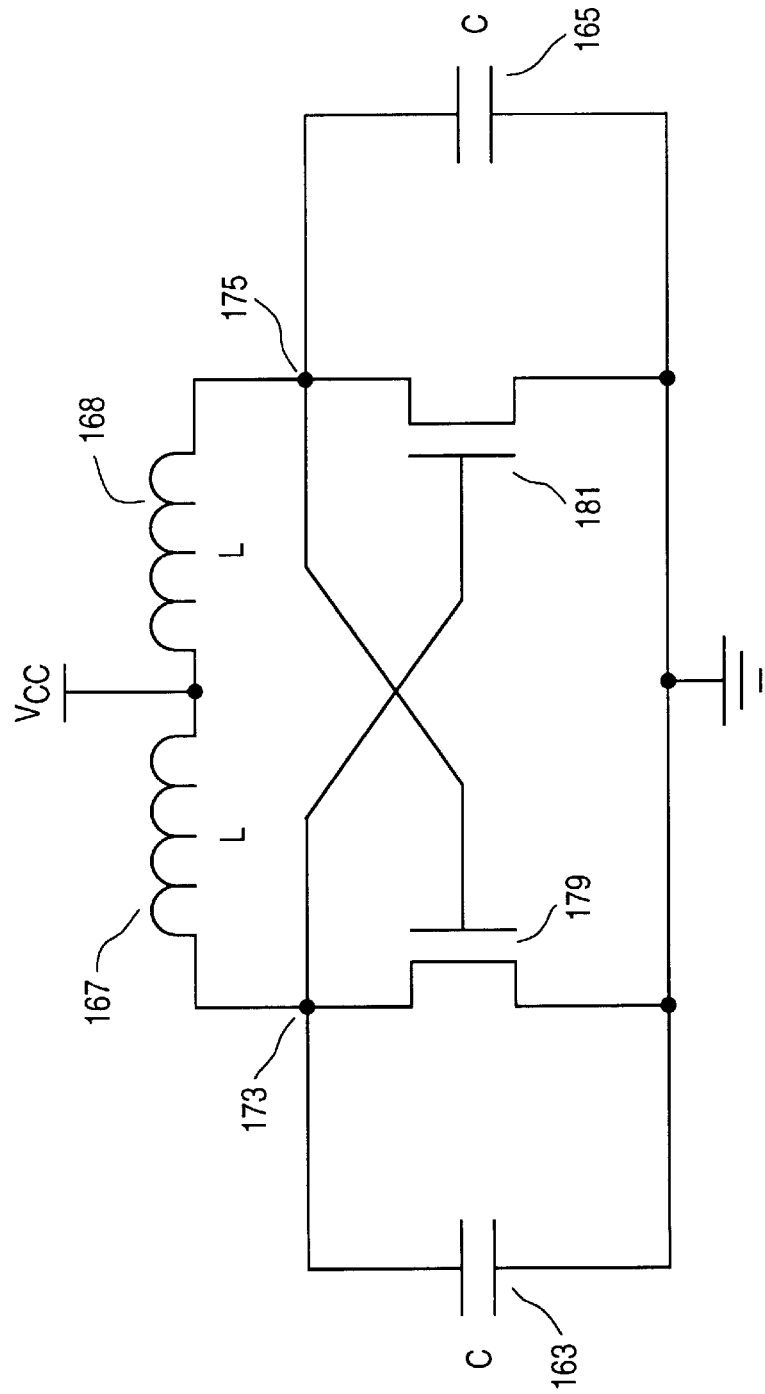
FIG. 1C is a schematic of another prior adiabatic waveform generation circuit.

A method and an apparatus for generating waveforms using an adiabatic waveform generation circuit is disclosed. In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

FIG. 2 is a schematic and block diagram of an adiabatic waveform generation circuit including an oscillating circuit 202 which generates oscillating waveforms at nodes 213 and 215. A replenishing circuit 219 generates replenishing outputs 225 and 227 which are coupled to nodes 213 and 215 of oscillating circuit 202. The present invention also includes a control circuit 217 which generates two control signals $\phi 1$ 221 and $\phi 2$ 223 which are coupled to replenishing circuit 219 as shown in FIG. 2. Control circuit 217 receives an input from node 213 of oscillating circuit 202 and reference clock signal REFCLK 229.

As shown in FIG. 2, oscillating circuit 202 includes an inductor 207 coupled between capacitors 203 and 205, which are coupled to ground respectively. The inherent resistance in the wires between the capacitors 203 and 205 and inductor 207 are modeled as resistors 209 and 211. A waveform oscillates between capacitors 203 and 205 through inductor 207.

Resistors 209 and 211 dissipate the power of the waveform which oscillates between capacitors 203 and 205. Replenishing circuit 219 provides replenishing signals 225 and 227 to the waveform oscillating between capacitors 203 and 205 at nodes 213 and 215 respectively. The waveform oscillates between capacitors 203 and 205 at a frequency and phase determined by the external reference clock REFCLK 229.

In one embodiment of the present invention, control circuit 217 compares the waveform generated at node 213 with the waveform received at REFCLK 229 and generates $\phi 1$ 221 and $\phi 2$ 223 in response to the comparison. Replenishing circuit 219 receives control signals $\phi 1$ 221 and $\phi 2$ 223 and generates the replenishing signals 225 and 227 accordingly to match the frequency and phase of the oscillating waveform of oscillating circuit 202 with REFCLK 229.

Therefore, the present invention allows the waveform generated in oscillating circuit 202 to be adjusted or controlled by an external reference clock such as REFCLK 229. Hence it is possible to integrate the adiabatic waveform generation circuit 201 with other circuits in an entire system operating at a frequency controlled by REFCLK 229.

Figure 3:
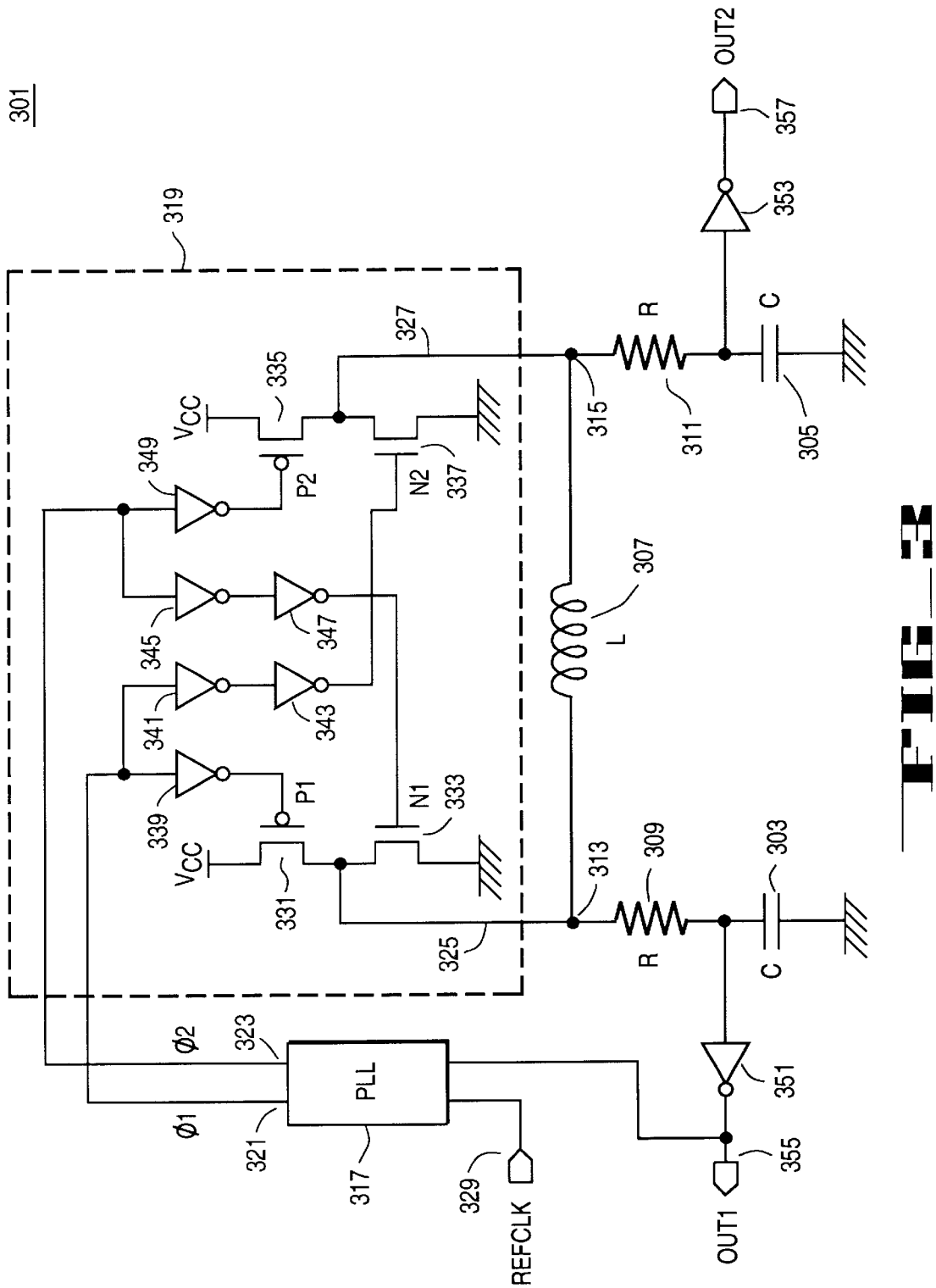
FIG. 3 is a schematic of one embodiment of an adiabatic waveform generation circuit in accordance with the teachings of the present invention.

FIG. 3 is a schematic of one embodiment of an adiabatic waveform generation circuit 301 in accordance with the teachings of the present invention. Oscillating circuitry is provided with inductor 307 coupled between capacitors 303 and 305, which are coupled to ground respectively. The resistance in the wire between capacitors 303 and inductor 307 is modeled as resistor 309. The resistance in the wire between inductor 307 and capacitor 305 is modeled as resistor 311.

Replenishing circuitry 319 includes p-channel transistor 331 and n-channel transistor 333, which are coupled between $V_{cc}$ and ground to provide replenishing signal 325 to node 313. P-channel transistor 335 and n-channel transistor 337 are coupled between $V_{cc}$ and ground to provide replenishing signal 327 to node 315. P-channel transistors 331 and 335 act as pull-up devices for nodes 313 and 315 respectively while n-channel transistors 333 and 337 act as pull-down devices for nodes 313 and 315 respectively.

As shown in FIG. 3, a phase lock loop (PLL) 317 is used in one embodiment of the present invention as the control circuit which receives a reference clock signal REFCLK 329 and compares it with a waveform generated at OUT1 355. PLL 317 correspondingly generates control signals φ1 321 and φ2 323 to control p-channel transistors 331 and 335 and n-channel transistors 333 and 337. The gate of p-channel transistor 331 receives φ1 321 through inverter 339. The gate of n-channel transistor 337 receives φ1 321 through inverters 341 and 343. The gate of n-channel transistor 333 receives control signal φ2 323 through inverters 345 and 347. The gate of p-channel transistor 335 receives control signal φ2 323 through inverter 349. The waveforms which oscillate between capacitors 303 and 305 are buffered through inverters 351 and 353 respectively to generate output signals OUT1 355 and OUT2 357.

Operation of adiabatic waveform generation circuit 301 is as follows. In contrast with the prior art schemes shown in FIGS. 1B and 1C, the present invention provides the signals to drive the replenishing circuitry 319 from PLL 317 instead of from the nodes or capacitors as shown in FIGS. 1B and 1C. In one embodiment of the present invention, control signals φ1 321 and φ2 323 of PLL 317 are 180 degrees out of phase from one another and have 25% duty cycles. As will be discussed, this effectively eliminates any short circuit current flowing through p-channel transistor 331 and n-channel transistor 333 and p-channel transistor 335 and n-channel transistor 337 during state transitions. PLL 317 generates control signals φ1 321 and φ2 323 by comparing the frequency and phase of the signal generated at OUT1 355 with the reference clock signal REFCLK 329. Replenishing signals 325 and 327 are accordingly generated to control the frequency and phase of the waveform oscillating between capacitors 303 and 305 to match the frequency and phase of the signal received at REFCLK 329.

In one embodiment of the present invention, weak inverters relatively small in size in comparison with the sizes of replenishing transistors 331, 333, 335 and 327 are employed. In one embodiment of the present invention, transistors 331, 333, 335 and 337 are approximately 800 to 1200 microns in size while the transistors of inverters 339, 341, 343, 345, 347 and 349 are in the order of 50 microns in size. As will be discussed in greater detail below, by using weak inverters in one embodiment of the present invention, triangle-type waveforms are applied to the gates of p-channel transistors 331 and 335 and n-channel transistors 333 and 337. Accordingly, p-channel transistors 331 and 335 gradually turn on and off when pulling up the voltages at nodes 313 and 315. Similarly, n-channel transistors 333 and 337 are gradually turned on and off when pulling down the voltages at nodes 313 and 315 respectively. By gradually turning on and off the transistors of the replenishing circuitry, glitches in the oscillating waveform between capacitors 303 and 305 are reduced therefore minimizing the deformation of a sinusoidal waveform oscillating between capacitors 303 and 305.

In addition, it is noted that in one embodiment of the present invention, inverters 339, 341, 343, 345, 347 and 349 are optimized so as to result in no overlapping of the triangular waveforms applied to the gates of p-channel transistors 331 and 335 and n-channel transistors 333 and 337. To illustrate, FIG. 4 shows a control signal 401 which corresponds with one of the control signals φ1 321 and φ2 323 output by PLL 317 of FIG. 3. It is appreciated that the other one of the control signals output by PLL 317 is similar to waveform 401 with the exception of being phase shifted by 180 degrees. For the sake of discussion, assume waveform 401 corresponds with φ1 321 of FIG. 3. Waveform 403 is an inverted triangle-type wave which is applied to the gate of p-channel transistor 331. Waveform 405 is a triangle-type wave applied to the gate of n-channel transistor 333. It is appreciated that there is no "overlap" of triangle waveforms 403 and 405. Specifically, waveform 403 will gradually turn on and then turn off p-channel transistor 331 before waveform 405 begins gradually turning on and turning off n-channel transistor 333. Therefore, a nearly sinusoidal waveform 407 is generated at node 313 with the aid of p-channel transistor 331 and n-channel transistor 333. As shown in FIG. 4, p-channel transistor 331 is gradually turned on and then turned off with waveform 403 and n-channel transistor 333 is gradually turned on and then turned off with waveform 405 which results in the nearly sinusoidal trace of waveform 407.

As also shown in FIG. 4, since waveform 403 completely shuts off p-channel transistor 331 before n-channel transistor 333 is gradually turned on and turned off with waveform 405, there is effectively no short circuit current which flows through p-channel transistor 331 and n-channel transistor 333 during state transitions. Accordingly, it is appreciated that by optimizing inverters 339, 341, 343, 345, 347 and 349, waveforms 403 and 405 are triangular in shape and do not overlap which therefore minimizes glitches in sinusoidal waveform 407 and minimizes any short circuit current flowing through the replenishing transistors of the present invention. That is, the short circuit current is minimized since the associated p and n-channel transistors of the replenishing circuitry of the present invention are never turned on simultaneously.

Waveform 409 of FIG. 4 is the square waveform output of inverter 351 at OUT1 355. As can be seen in FIG. 4, sinusoidal waveform 407 is converted into a square waveform 409 appearing at OUT1 355 with inverter 351.

It is appreciated that the analysis discussed above with respect to control signal φ1 321 and the corresponding waveforms 401, 403, 405, 407 and 409 may also be applied in the analysis of control signals φ2 323 with the exception of waveforms 401, 403, 405, 407 and 409 being phase-shifted by 180 degrees.

FIG. 5 is a schematic of another embodiment of the present invention. Adiabatic waveform generation circuitry 501 includes ordinary LC oscillation circuitry with inductor 507 coupled between capacitors 503 and 505. Wire resistances are modeled as resistor 509 coupled between capacitor 503 and inductor 507 and resistor 511 coupled between inductor 507 and capacitor 505. Capacitors 503 and 505 are coupled to ground respectively.

Replenishing circuitry 519 generates replenishing signals 525 and 527, which are coupled to the oscillation circuitry at nodes 513 and 515 respectively. P-channel transistor 531 and n-channel transistor 533 are coupled between $V_{cc}$ and ground to generate replenishing signal 525. P-channel transistor 535 and n-channel transistor 537 are coupled between $V_{cc}$ and ground to generate replenishing signal 527. It is noted that p-channel transistors 531 and 535 act as pull-up devices while n-channel transistors 533 and 537 act as pull-down devices. Control circuit PLL 517 generates control signals φ1 521 and φ2 523 to control the transistors 531, 533, 535 and 537 of the replenishing circuitry 519 to generate the replenishing signals 525 and 527. As shown in FIG. 5, control signal φ1 521 is coupled to the gate of p-channel transistor 531 through logical-NAND gate 539. Control signal φ1 521 is also received by the gate of n-channel transistor 537 through logical-NAND gate 541 and inverter 543 as shown in FIG. 5. Control signal φ2 523 is received by the gate of n-channel transistor 533 through logical-NAND gate 545 and inverter 547 as shown in FIG. 5. The gate of p-channel transistor 535 is also coupled to receive control signal φ2 523 through logical-NAND gate 549.

As shown in FIG. 5, an enable signal ENABLE 559 is also coupled to the inputs of logical-NAND gates 539, 541, 545 and 549. When enable signal ENABLE 559 is set to "0," the replenishing circuitry of adiabatic waveform generation circuit 501 is disabled and will therefore not generate waveforms. This is because when a "0" received by logical-NAND gates 539, 541, 545 and 549, transistors 531, 533, 535 and 537 are all switched off irrespective of control signals φ1 521 and φ2 523. However, when enable signal ENABLE 559 set to "1" control signals φ1 521 and φ2 523 are received by transistors 531, 533, 535 and 537 of the replenishing circuitry 519 to generate replenishing signals 525 and 527 respectively.

Control circuit PLL 517 is coupled to receive an external reference clock REFCLK 529 and the output waveform OUT1 555 to generate control signals φ1 521 and φ2 523. As a result, the output waveforms OUT1 555 and OUT2 557 are controlled and adjusted with PLL 517 to match the frequency and phase of the external reference clock signal REFCLK 529.

Inverters 551 and 553 are coupled to capacitors 503 and 505 to convert the sinusoidal waveform oscillating between capacitors 503 and 505 into square waveform outputs at OUT1 555 and OUT2 557.

The waveforms discussed with respect to FIG. 4 above also correspond with the adiabatic waveform generation circuit 501 of FIG. 5. In particular, PLL 517 generates control signals φ1 521 and φ2 523 which are 25% duty cycle pulses 180 degrees out of phase from one another. Accordingly waveform 401 of FIG. 4 may apply to either control signal φ1 521 or control signal φ2 523. For the sake of illustration, assuming that waveform 401 corresponds with the control signal φ1 521, and that the enable signal ENABLE 559 is "1," waveform 403 corresponds with the input to the gate of p-channel transistor 531 and waveform 405 corresponds with the input to n-channel transistor 533. Waveform 407 corresponds with the sinusoidal waveform generated at node 503 and square waveform output 409 corresponds with OUT1 555.

It is appreciated that the replenishing circuitry of adiabatic waveform generation circuit 501 has also been optimized to produce the triangle-type waveforms at the gates of the transistors of the replenishing circuitry so as to prevent the p-channel transistor 531 and n-channel transistor 533 from being switched on simultaneously and to gradually turn on and then turn off each transistor to minimize the glitches in sinusoidal waveform 407.

It is also appreciated that the waveforms output by control signal φ2 523, inputs to the gates of p-channel transistor 535 and n-channel transistor 537, generated at node 515 and at output OUT2 557 correspond with waveforms 401, 403, 405, 407 and 409 with the exception of being phase-shifted by 180 degrees.

FIG. 6 is a schematic of yet another embodiment of an adiabatic waveform generation circuit 601 in accordance with the teachings of the present invention. As can be observed, the schematic of adiabatic waveform generation circuit 601 is identical to the schematic of adiabatic waveform generation circuit 501 with the exception of NOR gates 639 and 649 of repleneshing circuitry 619 being used in FIG. 6 instead of the logical-NAND gates 539 and 549 of repleneshing circuitry 519 being used in FIG. 5. In addition, inverter 661 has been added between an input of logical-NOR gate 639 and logical-NOR gate 649 and the enable signal 659 as shown in FIG. 6.

Operation of the adiabatic waveform generation circuit 601 is the same as the operation of adiabatic waveform generation circuit 501. The replenishing circuitry of adiabatic waveform generation circuit 601 has also been optimized to provide non-overlapping triangle-type waveforms as shown in FIG. 4 to the inputs of the replenishing circuitry 619 transistors 631, 633, 635 and 637 to prevent short circuit currents through the transistors and to prevent glitches in the sinusoidal waveform 407 oscillating between capacitors 603 and 605. PLL 617 compares the output signal OUT1 655 with the external reference clock REFCLK 629 to generate the control signals φ1 621 and φ2 623 to control and adjust the frequency and phase of the waveform oscillating between capacitor 603 and 605. Inverters 651 and 653 are coupled to capacitors 603 and 605 respectively to generate the square-type oscillating waveforms at OUT1 655 and OUT2 657.

FIG. 7 is a schematic of yet another embodiment of an adiabatic waveform generation circuit 701 in accordance with the teachings of the present invention. As can be observed, adiabatic waveform generation circuit 701 is a simplified embodiment of adiabatic waveform generation circuits 501 and 601 in that the replenishing circuitry 719 only includes logical-NAND gates 741 and 745 and inverters 743 and 747. In the embodiment shown in FIG. 7, the gates of p-channel transistors 731 and 735 are cross-coupled to the nodes 713 and 715 respectively of the oscillating circuit. The gates of the n-channel transistors 733 and 737 are respectively coupled to control signals φ1 721 and φ2 723 through logical-NAND gate 741 and inverter 743 and logical-NAND gate 745 and inverter 747 respectively. PLL 717 compares the output waveform at OUT1 755 with the external reference clock waveform REFCLK 729 to generate the control signals φ1 721 and φ2 723 to generate replenishing signals 725 and 727 which are coupled to the oscillating circuit at nodes 713 and 715 respectively.

Similar to the embodiments described above, control signals φ1 721 and φ2 723 are 25% duty cycle waveforms 180 degrees out of phase. The sinusoidal wave form which oscillates between capacitors 703 and 705 through inductor 707 and resistors 709 and 711 is converted into square output waveforms through inverters 751 and 753 coupled to capacitors 703 and 705 respectively. The square output waveforms are generated at OUT1 755 and OUT2 757.

Enable signal ENABLE 759 is coupled to an input of logical-NAND gate 741 and an input logical-NAND gate 745 to enable and to disable the adiabatic waveform generation circuit 701. That is, when ENABLE is "1," the transistors of the replenishing circuit are coupled to receive the control signals φ1 721 and φ2 723 to generate the replenishing signals 725 and 727. However, when ENABLE is "0," the replenishing signals 725 and 727 are not generated and adiabatic waveform generation circuit 701 discontinues generating oscillating waveforms at OUT1 755 and OUT2 757.

Thus, what has been described is a method and an apparatus for generating oscillating waveforms with an adiabatic waveform generation circuit. With the presently described waveform generation circuit, oscillating waveforms are generated using energy recovery circuits resulting in considerably less power consumption. The described waveform generation circuit may be used in low power applications requiring oscillating waveforms such as, for example, clock driver circuitry or the like. The described adiabatic waveform generation circuit may be controlled with an external reference clock and suffers from minimal short circuit current through the replenishing circuitry and generates oscillating sinusoidal waveforms with minimal glitches.

In the foregoing detailed description, the method and apparatus of the present invention has been described with reference to specific exemplary embodiments thereof. It will, however, be evident that there is modifications and changes may be made thereto without departing from the broader spirit and scope of the present invention. The present specification and figures are accordingly to be recorded as illustrative rather than restrictive.

What is claimed is:

1. An adiabatic waveform generation circuit, comprising:
   an oscillating circuit generating first and second oscillating outputs:
   a replenishing circuit generating first and second replenishing outputs coupled to the oscillating circuit, the replenishing circuit comprising:
     a first pull-up device coupled between a first potential and a first node of the oscillating circuit,
     a first pull-down device coupled between a second potential and the first node,
     a second pull-up device coupled between the first potential and a second node of the oscillating circuit,
     a second pull-down device coupled between the second potential and the second node;
   a control circuit generating first and second control signals coupled to the replenishing circuit, the control circuit further coupled to one of the first and second oscillating outputs, the control circuit controlling a frequency of oscillation of the oscillating circuit; and
   an enable input, the oscillating circuit generating the first and second oscillating outputs in response to the enable input.

2. The adiabatic waveform generation circuit described in claim 1 wherein the replenishing circuit further comprises:
   a first logical-NAND gate having an output coupled to the first pull-up device, the first logical-NAND gate further having first and second inputs coupled to the first control signal and the enable signal respectively;
   a second logical-NAND gate having first and second inputs coupled to the first control signal and the enable signal respectively;
   a first inverter having an input coupled to an output of the second logical-NAND gate, the first inverter further having an output coupled to the second pull-down device;
   a third logical-NAND gate having first and second inputs coupled to the second control signal and the enable signal respectively;
   a second inverter having an input coupled to an output of the third logical-NAND gate, the second inverter further having an output coupled to the first pull-down device; and
   a fourth logical-NAND gate having an output coupled to the second pull-up device, the fourth logical-NAND gate further having first and second inputs coupled to the second control signal and the enable signal respectively.

3. The adiabatic waveform generation circuit described in claim 1 wherein the replenishing circuit further comprises:
   a first inverter having an input coupled to the enable input;
   a first logical-NOR gate having an output coupled to the first pull-up device, the first logical-NOR gate further having first and second inputs coupled to the first control signal and an output of the first inverter respectively;
   a first logical-NAND gate having first and second inputs coupled to the first control signal and the enable signal respectively;
   a second inverter having an input coupled to an output of the first logical-NAND gate, the second inverter further having an output coupled to the second pull-down device;
   a second logical-NAND gate having first and second inputs coupled to the second control signal and the enable signal respectively;
   a third inverter having an input coupled to an output of the second logical-NAND gate, the third inverter further having an output coupled to the first pull-down device; and
   a second logical-NOR gate having an output coupled to the second pull-up device, the second logical-NOR gate further having first and second inputs coupled to the second control signal and the output of the first inverter respectively.

4. The adiabatic waveform generation circuit described in claim 1 wherein the replenishing circuit further comprises:
   a first logical-NAND gate having first and second inputs coupled to the first control signal and the enable signal respectively;
   a first inverter having an input coupled to an output of the first logical-NAND gate, the first inverter further having an output coupled to the first pull-down device;
   a second logical-NAND gate having first and second inputs coupled to the second control signal and the enable signal respectively;
   a second inverter having an input coupled to an output of the second logical-NAND gate, the second inverter further having an output coupled to the second pull-down device;
   wherein the second replenishing output is further coupled to the first pull-up device; and
   wherein the first replenishing output is further coupled to the second pull-up device.

5. The adiabatic waveform generation circuit described in claim 1 wherein the control circuit is further coupled to receive a reference clock signal, the control circuit generating the first and second control signals in response to the reference clock signal and the first oscillating output.

6. In an adiabatic waveform generation circuit, a method of generating first and second oscillating waveforms, the method comprising the steps of:
   generating the first and second oscillating waveforms approximately 180 degrees out of phase from one another at first and second oscillating outputs of an oscillation circuit;

replenishing the first and second oscillating waveforms with first and second replenishing outputs respectively of a replenishing circuit, the first and second replenishing outputs generated in response to an enable signal; and controlling a frequency of oscillation of the first and second oscillating waveforms with first and second control signals coupled to the replenishing circuit.

7. The method described in claim 6 wherein the step of controlling the frequency of oscillation includes the steps of:

generating the first and second control signals with a control circuit in response to one of the first and second oscillating waveforms and a reference clock; and generating the first and second replenishing outputs in response to the first and second control signals.

8. The method described in claim 7 wherein the step of replenishing the first and second waveforms includes repeating the sequential steps of:

gradually coupling the first oscillating output up to a first potential while simultaneously gradually coupling the second oscillating output down to a second potential in response to the first and second control signals;

gradually decoupling the first oscillating output from the first potential while simultaneously gradually decoupling the second oscillating output from the second potential in response to the first and second control signals;

gradually coupling the first oscillating output down to the second potential while simultaneously gradually coupling the second oscillating output up to the first potential in response to the first and second control signals; and gradually decoupling the first oscillating output from the second potential while simultaneously gradually decoupling the second oscillating output from the first potential in response to the first and second control signals.

9. The method described in claim 8 wherein the step of gradually coupling the first oscillating output up to the first potential is performed only after the step of-gradually decoupling the first oscillating output from the second potential is substantially completed and the step of gradually coupling the first oscillating output down to the second potential is performed only after the step of decoupling the first oscillating output from the first potential is substantially completed.

10. An adiabatic waveform generation circuit, comprising:

waveform generation means for generating first and second oscillating outputs;

replenishing means coupled to the waveform generation means for replenishing the first and second oscillating outputs;

control means coupled to the waveform generation means and the replenishing means for controlling a frequency of oscillation of the first and second oscillating outputs; and enabling means for enabling the waveform generation means to generate the first and second oscillating waveforms.

11. The adiabatic waveform generation circuit described in claim 10 further comprising a reference clock received by the control means, the control means controlling the frequency of oscillation of the first and second oscillating outputs in response to the reference clock and one of the first and second oscillating outputs.

12. An adiabatic waveform generation circuit, comprising:

an oscillating circuit generating first and second oscillating outputs, the oscillating circuit coupled to an enable input, the oscillating circuit generating the first and second oscillating inputs in response to the enable input;

a replenishing circuit generating first and second replenishing outputs coupled to the oscillating circuit; and a control circuit generating first and second control signals coupled to the replenishing circuit, the control circuit further coupled to one of the first and second oscillating outputs, the control circuit controlling a frequency of oscillation of the oscillating circuit, the control circuit coupled to receive a reference clock signal, the control circuit generating the first and second control signals in response to the reference clock signal and the first oscillating output.

* * * * *